United States Patent
Pang (10) Patent No.: US 9,279,601 B2
(45) Date of Patent: Mar. 8, 2016

(54) SOLAR ENERGY SYSTEM

(71) Applicant: Yi Pang, Olney, MD (US)

(72) Inventor: Yi Pang, Olney, MD (US)

( * ) Notice: Subject to any disclaimer, the term of this patent is extended or adjusted under 35 U.S.C. 154(b) by 177 days.

(21) Appl. No.: 14/246,104

(22) Filed: Apr. 6, 2014

(65) Prior Publication Data

US 2014/0311551 A1 Oct. 23, 2014

Related U.S. Application Data

(60) Provisional application No. 61/813,111, filed on Apr. 17, 2013.

(51) Int. Cl.
*H02N 6/00* (2006.01)
*H01L 31/042* (2014.01)
*F24J 2/34* (2006.01)
*F24J 2/32* (2006.01)
*H01L 31/052* (2014.01)
*H02S 40/44* (2014.01)

(52) U.S. Cl.
CPC .. *F24J 2/345* (2013.01); *F24J 2/32* (2013.01); *H01L 31/0521* (2013.01); *H02S 40/44* (2014.12); *Y02E 10/50* (2013.01); *Y02E 10/60* (2013.01); *Y02P 80/24* (2015.11); *Y02P 80/25* (2015.11)

(58) Field of Classification Search
CPC ... H01L 31/052; H01L 31/0521; H02S 40/40; H02S 40/42; H02S 40/425; H02S 40/44; F24J 2/32; F24J 2/34; F24J 2/345
See application file for complete search history.

(56) References Cited

U.S. PATENT DOCUMENTS

| | | | |
|---|---|---|---|
| 3,775,257 A * | 11/1973 | Lovrich | C02F 1/14 159/903 |
| 4,119,143 A | 10/1978 | Robinson, Jr. | |
| 4,194,949 A | 3/1980 | Stark | |
| 4,238,873 A * | 12/1980 | Frank | F24D 17/0021 126/590 |
| 4,412,528 A | 11/1983 | Elzinga, Jr. | |
| 4,509,590 A | 4/1985 | Svetlik | |
| 4,898,231 A * | 2/1990 | Miyazaki | F28D 15/0233 165/104.25 |
| 5,088,471 A | 2/1992 | Bottum | |
| 5,398,519 A | 3/1995 | Weber et al. | |
| 5,458,189 A | 10/1995 | Larson et al. | |
| 6,220,337 B1 | 4/2001 | Chen et al. | |
| 6,391,162 B1 * | 5/2002 | Kamiya | C02F 1/14 126/569 |
| 2003/0038022 A1 | 2/2003 | Rogde | |
| 2009/0223511 A1 * | 9/2009 | Cox | F24D 3/12 126/714 |
| 2009/0301468 A1 * | 12/2009 | Gray | F24D 11/003 126/640 |
| 2011/0011802 A1 * | 1/2011 | Maydan | C02F 1/02 210/652 |
| 2011/0232633 A1 * | 9/2011 | Lima | A01G 9/243 126/628 |
| 2013/0340745 A1 * | 12/2013 | Kazadi | F24J 2/32 126/636 |

* cited by examiner

*Primary Examiner* — Eli Mekhlin
(74) *Attorney, Agent, or Firm* — Louis Ventre, Jr.

(57) ABSTRACT

A solar energy system includes a solar energy receiver and a matrix of pipes containing a working fluid attached to the bottom side of the receiver. The matrix is a plurality of vertically-tilted pipes and at least three horizontal pipes arranged in a specific order and have a defined function. The working fluid absorbs heat and changes from a liquid to a gas. The system further includes a thermal storage tank, which includes a heat storage medium and a heat exchanger. The heat exchanger receives evaporated working fluid from one of the horizontal pipes, condenses the working fluid vapor by transferring heat to the heat storage medium. When water is the working fluid, a distilled water storage tank may be connected to the heat exchanger to receive distilled water. When recirculation of the working fluid is desired, condensed liquid from the heat exchanger is flowed to a horizontal pipe.

14 Claims, 5 Drawing Sheets

SOLAR ENERGY SYSTEM

CROSS-REFERENCE TO RELATED APPLICATIONS

This application claims the benefit of U.S. Provisional Application No. 61/813,111, filed 17 Apr. 2013, which is hereby incorporated by reference herein.

TECHNICAL FIELD

In the field of solar energy, a system to provide thermal energy or both electricity and thermal energy, as well as distilled water as byproduct of solar radiation.

BACKGROUND ART

Phase change heat transfer has been utilized in numerous applications from air conditioning to solar heating. Heat pipes are well known for employing phase transition and gravity for operability. However for the heat pipe, there is one drawback of contra-flow of vapor and liquid in the same pipe, which limits the transfer rate and the distance.

The loop heat pipe uses a chilled liquid that flows to the bottom of a solar collector. However, this technology introduces problems associated with the liquid level inside of the solar collector: if the liquid level is low, there can be a deficit of liquid in the upper part of the solar collector and, as a consequence, the temperature of the solar collector can rise to destructive levels, especially for a combination photovoltaic and thermal application. Also, when the liquid level is high, there can be a large flow of liquid out of the vapor pipe, preventing effective heat transfer.

Solar energy is still not quite competitive to traditional fossil energy in terms of return on investment (ROI). While the industry continues to strive to lower system cost (the denominator of ROI), another direction is to increase the return (the numerator of ROI).

SUMMARY OF INVENTION

A solar energy system includes a solar energy receiver and a matrix of pipes attached to the bottom side of the receiver. The matrix of pipes is used to transfer heat and includes vertically-tilted pipes interconnected by at least three horizontal pipes. The required three horizontal pipes are a bottom-horizontal pipe at a lower or bottom section on the vertically-tilted pipes; a top-horizontal pipe located in a top section; and a working-fluid-supply pipe located in the top section. A working fluid, which is a liquid, fills the bottom-horizontal pipe and a portion of each vertically-tilted pipe.

A thermal storage tank contains a heat storage medium and a heat exchanger. The preferred heat storage medium is water. The heat exchanger receives evaporated working fluid from the top-horizontal pipe, which is the vapor pipe. It condenses the vapor to a liquid state by transferring heat to the heat storage medium. An optional piped connection between the heat exchanger and the working-fluid-supply pipe receives condensed working fluid, preferably by action of gravity. A bypass pipe may interconnect the top-horizontal pipe to the bottom-horizontal pipe to allow the liquid form of the work fluid to flow to the bottom-horizontal pipe.

When water is the working fluid, a distilled water storage tank may be connected to the heat exchanger so that the liquid state of the working fluid in the heat exchanger flows into the distilled water storage tank. The distilled water tank may be used as a heat exchanger and located within the thermal storage tank. A working-fluid-supply tank connects and supplies make-up working fluid to the working-fluid-supply pipe. When the working fluid comprises water, the working-fluid-supply tank may be referred to as a raw water tank, and this system becomes a water purifier or desalinator if raw water is sea water. If the heat storage medium is also water, then the thermal storage tank can also be used as the raw water tank.

When recirculation of the working fluid is desired, condensed liquid from the heat exchanger is flowed to the working-fluid-supply pipe.

A non-condensable gas chamber may be connected to the heat exchanger to permit non-condensable gases in the working fluid vapor to accumulate and optionally to be removed. For removal, a vacuum pump may be connected to the non-condensable gas chamber to remove non-condensable gases in the non-condensable gas chamber and to hold the system at less than atmospheric pressure when desired for improved efficiency.

The system may also be operated using multiple solar energy receivers.

Solution to Problem

The solution is a solar energy system that employs a unique piping matrix to control the liquid level in the system and efficiently utilize solar energy. The system to provide thermal energy or both electricity and thermal energy (photovoltaic and thermal or PV/T), as well as distilled water as byproduct. It can also be used for cooling a photovoltaic (PV) system and producing distilled water if the heat from a solar thermal system is not needed.

The piping matrix contains a working fluid that utilizes phase transition for optimum heat transfer away from the bottom surface of the solar panel. The working fluid flows into the piping structure through a horizontal liquid pipe that interconnects the vertically inclined pipes in the upper part of the piping matrix. As the liquid flows down, it wets the vertically inclined pipes. It may also employ a bypass pipe to guide entrained liquid in the vapor pipe to the bottom-horizontal pipe. A non-condensable gas chamber at the top of the heat exchanger collects the non-condensable gas, which allows the system to operate efficiently even at less than perfect vacuum conditions.

Advantageous Effects of Invention

The disclosed solar energy system enables use of solar radiation to produce heat, electricity and also distilled water at the same time. This significantly improves the return on investment (ROI) compared to the existing solar systems, to wit, photovoltaics or solar thermal. For many applications, purified water holds much higher value than that of electricity or heat produced by the solar system.

The disclosed solar energy system utilizes a three-horizontal pipe structure interconnecting vertically inclined pipes that form a piping matrix connected to the bottom of a solar collector to provide a highly efficient and inexpensive device for producing heat and distilled water.

Compared to non-phase-transition working fluid circulation (natural or forced), the disclosed system has much better performance in terms of heat throughput because heat transfer by phase transition can collect (and release) a much larger amount of heat. Compared to forced circulation, which consumes electricity, this system is operable without electricity for working fluid circulation.

As a water purifier or desalinator, it does not consume an expensive filter cartridge, such as a reverse osmosis (RO) filter. It also does not consume noticeable energy (or even solar energy), unlike traditional water distillation. Rather, distilled water is a byproduct of a phase-transitional thermal transport process.

BRIEF DESCRIPTION OF DRAWINGS

The drawings illustrate preferred embodiments of the solar energy system according to the disclosure. The reference numbers in the drawings are used consistently throughout. New reference numbers in FIG. 2 are given the 200 series numbers. Similarly, new reference numbers in each succeeding drawing are given a corresponding series number beginning with the figure number.

DESCRIPTION OF EMBODIMENTS

In the following description, reference is made to the accompanying drawings, which form a part hereof and which illustrate several embodiments of the present invention. The drawings and the preferred embodiments of the invention are presented with the understanding that the present invention is susceptible of embodiments in many different forms and, therefore, other embodiments may be utilized and structural, and operational changes may be made without departing from the scope of the present invention.

Figure 1:
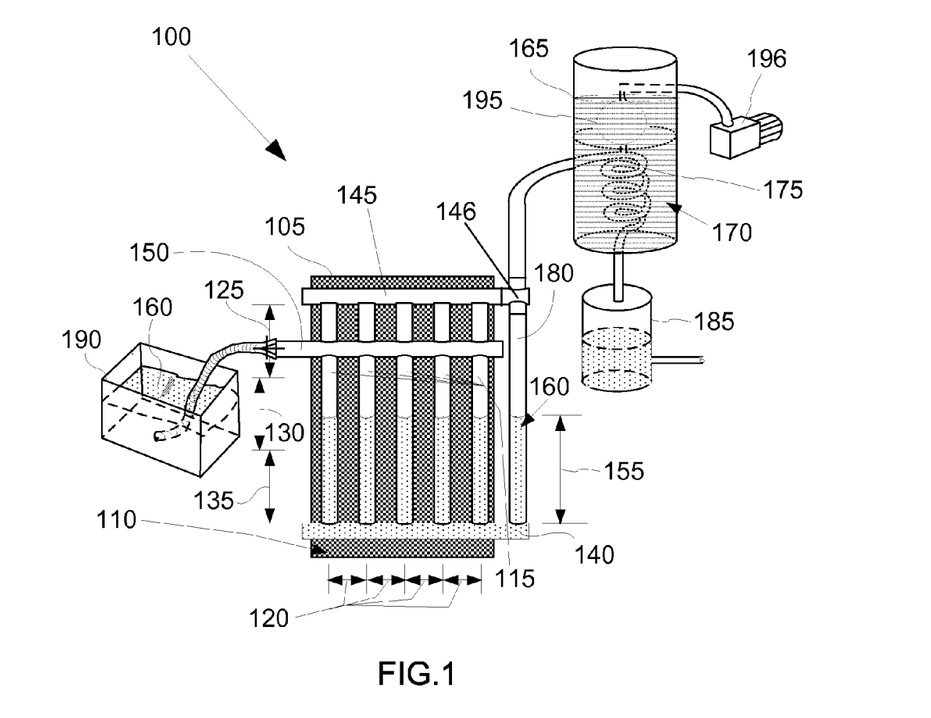
FIG. 1 is a perspective view of a solar energy system that collects distilled working fluid.

A solar energy system (100), shown in FIG. 1, includes: a solar energy receiver (105); a plurality of vertically-tilted pipes (115); at least three horizontal pipes consisting of: a bottom-horizontal pipe (140), a top-horizontal pipe (145), and a working-fluid-supply pipe (150); working fluid consisting of a liquid (160); a thermal storage tank (165); and a heat exchanger (175). The plurality of vertically-tilted pipes (115) and the required three horizontal pipes comprise a matrix of pipes.

Figures 2, 3:
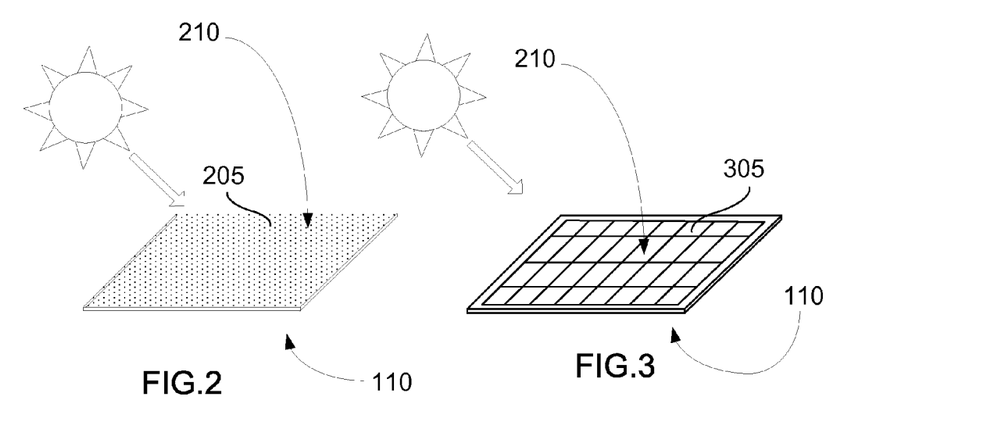
FIG. 2 is a perspective view of one kind of flat plate collector shown with respect to the sun.
FIG. 3 is a perspective view of a panel of photovoltaic cells shown with respect to the sun.

The solar energy receiver (105) may be any solar energy device that receives incident solar radiation and delivers it as heat or electricity. One or more of such solar energy receiver (105) may be utilized. Thus, a type of solar energy receiver (105) is a flat plate collector (205) having a sun-facing side (210) coated with solar absorption layer for solar thermal collection, one variety of which is illustrated in FIG. 2. Another type of solar energy receiver (105) is a panel of photovoltaic cells (305), one variety of which is illustrated in FIG. 3. The concepts disclosed herein may be utilized with a single solar energy receiver (105) or a plurality of solar energy receivers and the plurality of solar energy receivers may be mixed as to the type plurality of solar energy receiver.

The solar energy receiver (105) has a bottom side (110), which is opposite a sun-facing side (210). The sun-facing side (210) receives incident solar energy radiation as depicted in FIG. 2 and FIG. 3.

Each "pipe" in the matrix of pipes disclosed herein is preferably formed where at least part of the wall of the pipe is the bottom side (110) of the solar energy receiver (105). Thus, the term "pipe" as used herein is defined to include enclosed flow paths defined by combining channels, for example u-shaped channels, with the bottom side (110) of the solar energy receiver (105) so as to form an enclosed flow path. The u-shaped channels when welded or attached to the bottom side (110) of the solar energy receiver (105) form a pipe within the meaning intended. In this sense, the bottom side (110) of the solar energy receiver (105) forms part of the pipe by closing off the missing part of the u-shaped tubes. Each pipe, formed using the bottom wall of the solar energy receiver (105) to close the u-shaped tube, then fully contains liquid flow while enabling direct wetting of a portion of the bottom of the solar energy receiver (105).

Each vertically-tilted pipe in the plurality of vertically-tilted pipes (115) is preferably composed of individual pipes or channels that are spaced apart (120), meaning that they are separated by distance from each other.

The plurality of vertically-tilted pipes (115) is in thermal communication with the bottom side (110) of the solar energy receiver (105), so that the plurality of vertically-tilted pipes (115) functions as a heat sink for the solar energy receiver (105). The spaced apart arrangement is anticipated to be the most cost effective structure. However, designs where the pipes are butted up against each other are an alternative arrangement where cost is not an overriding consideration and maximal heat sink coverage is sought.

Preferably, each vertically-tilted pipe in the plurality of vertically-tilted pipes (115) is identified by, and comprises, a top section (125), a middle section (130) and a bottom section (135).

Figure 6:
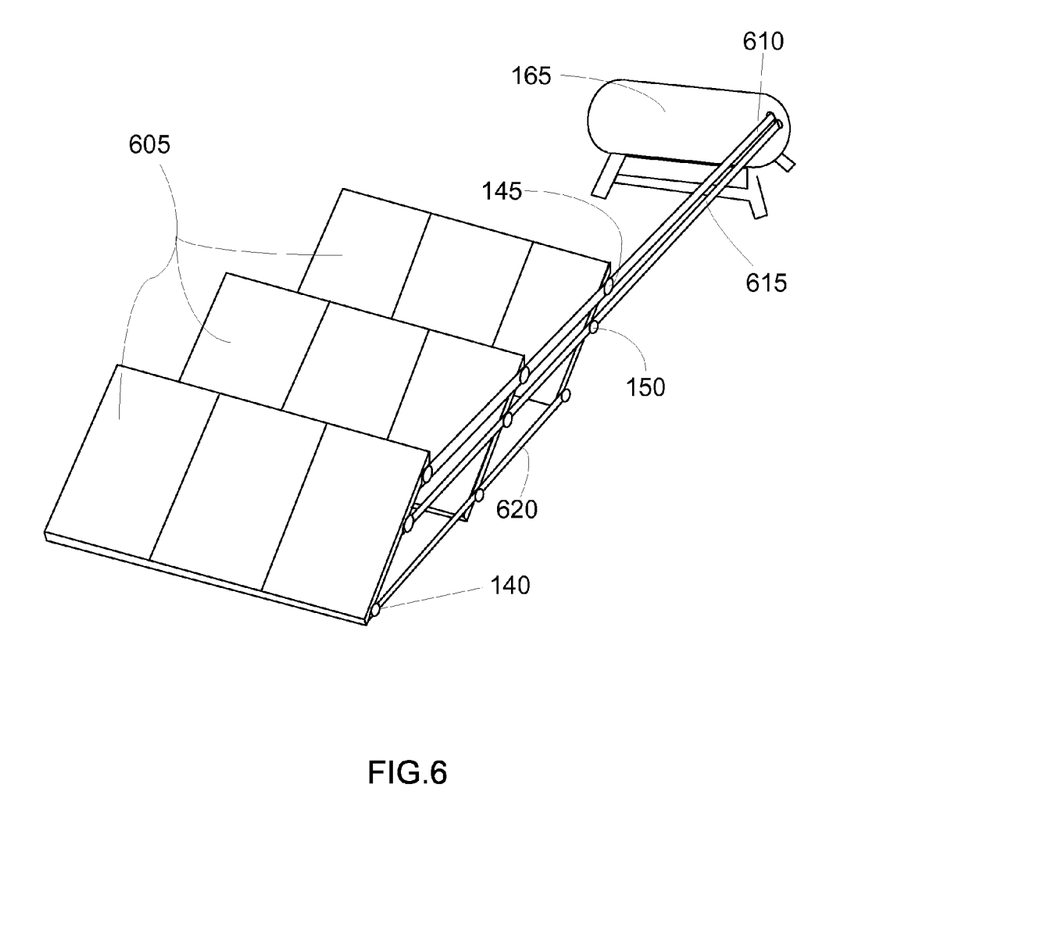
FIG. 6 is an alternative embodiment of the solar energy system that has multiple solar energy receivers.

When more than one solar energy receiver is employed, as shown in FIG. 6, a plurality of solar energy receivers (605) is employed. As with the embodiment having a single solar energy receiver, each solar energy receiver in the plurality of solar energy receivers (605) has a plurality of vertically-tilted pipes (115) in thermal communication with the bottom side (110) of each solar energy receiver (105) in the plurality of solar energy receivers. Thus, the plurality of vertically-tilted pipes (115) functions as a heat sink for each such solar energy receiver (105). For this arrangement, each top-horizontal pipe (145) in each solar energy receiver (105) is interconnected with a first interconnecting pipe (610), which also connects to the thermal storage tank (165); each working-fluid-supply pipe (150) is interconnected with a second interconnecting pipe (615), which also connects to the thermal storage tank (165); and each bottom-horizontal pipe (140) is interconnected with a third interconnecting pipe (620).

The three horizontal pipes are referred to as the required three horizontal pipes: although there may be more than three such pipes, three are required. Each of the required three horizontal pipes flowably interconnects the plurality of vertically-tilted pipes (115). Thus, the required three horizontal pipes consist of: a bottom-horizontal pipe (140) located in the bottom section (135); a top-horizontal pipe (145) located in the top section (125); and a working-fluid-supply pipe (150) located in the top section (125). Preferably, the top-horizontal pipe (145) is for gaseous working fluid and is preferably located above the working-fluid-supply pipe (150).

The working fluid is a liquid (160) at atmospheric temperature and pressure. The liquid (160) fills the bottom-horizontal pipe (140) and a portion (155) of each vertically-tilted pipe in the plurality of vertically-tilted pipes (115). The working fluid must be able to change state from a liquid to a gas over the operating temperature of the solar energy receiver (105). Such working fluids are well known in the art and include water, ammonia, and alcohol to name just a few.

The thermal storage tank (165) includes a heat storage medium (170). The heat storage medium (170) may be any of a wide variety of materials of either solid or liquid nature that can absorb heat from the gaseous state of the working fluid so that the working fluid changes state from a gas to a liquid. Preferably, the heat storage medium (170) is water because it is inexpensive and widely available. When water is also the heat storage medium (170), the thermal storage tank (165) may also be used to supply domestic hot water. Thus, for some embodiments, the heat storage medium (170) in the thermal storage tank (165) comprises water. Preferably, the thermal storage tank (165) with the heat exchanger (175) is located at a higher elevation than the solar energy receiver (105).

The heat exchanger (175) is located within the thermal storage tank (165) and is the device that isolates the working fluid from the heat storage medium (170), yet permits heat transfer from the gaseous working fluid to the heat storage medium (170). Thus, the heat exchanger (175) is in fluid communication with at least one of the required three horizontal pipes so as to receive the working fluid in gaseous state and condense it to a liquid (160) state by transferring heat to the heat storage medium (170).

Preferably, there is a piped connection (405) between the heat exchanger (175) and the working-fluid-supply pipe (150) such that the liquid (160) state of the working fluid in the heat exchanger (175) is returned by gravity to the plurality of vertically-tilted pipes (115). Thus, an alternative embodiment of the solar energy system (100), shown in FIG. 4, includes piped connection (405) from the heat exchanger (175) to the working-fluid-supply pipe (150) so that condensed working fluid, namely the liquid (160), can be returned to the plurality of vertically-tilted pipes (115). For this embodiment the heat exchanger (175) is in fluid communication with the working-fluid-supply pipe (150). For example, when the working fluid comprises water the heat exchanger (175) is in fluid communication with the working-fluid-supply pipe (150) so that liquid water is returned to the plurality of vertically-tilted pipes (115).

Figure 4:
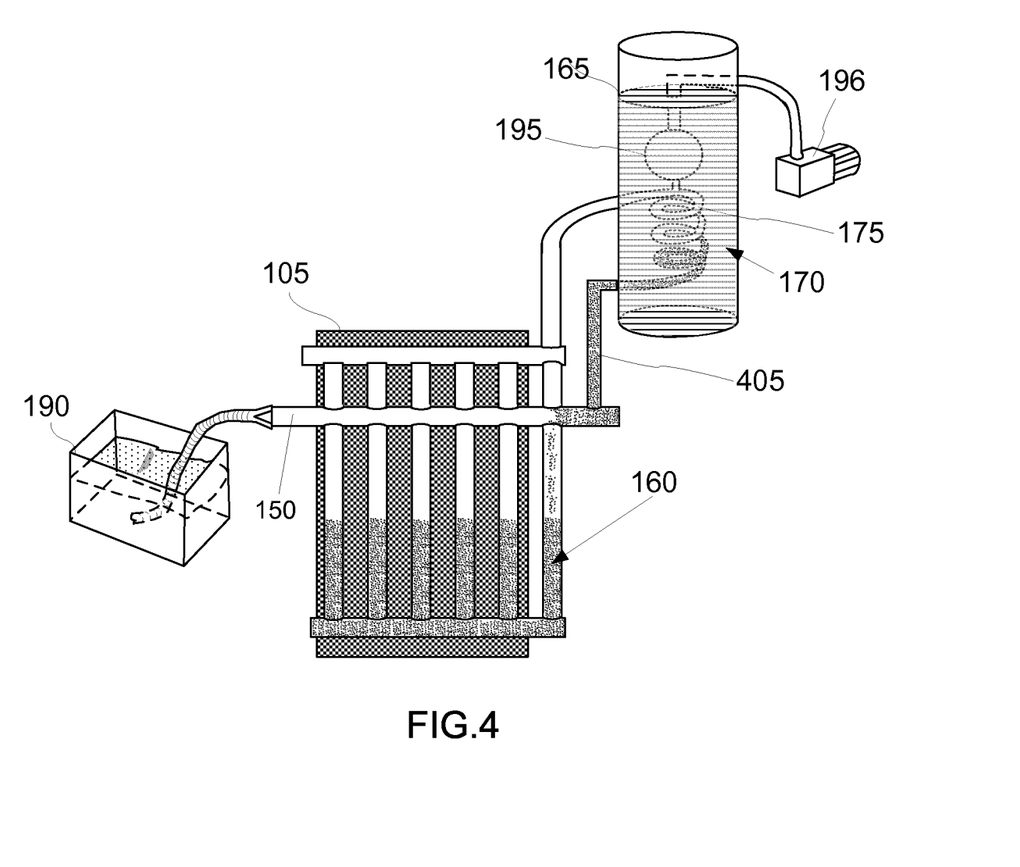
FIG. 4 is an alternative embodiment of the solar energy system that recycles the working fluid.

An alternative embodiment of the solar energy system (100) includes a non-condensable gas chamber (195) connected to the heat exchanger (175) and operable to permit non-condensable gases in the working fluid in gaseous state to flow into the non-condensable gas chamber (195) and be periodically evacuated from the system. As shown in FIG. 1, the non-condensable gas chamber (195) is connected to the top of the heat exchanger (175), which in this case is in the form of a coiled pipe. Preferably, both the non-condensable gas chamber (195) and the winding pipe are immersed in the heat storage medium (170), for example water, as shown in FIG. 1. The non-condensable gas chamber (195) may be located above the heat storage medium (170), for example water. Preferably, the non-condensable gas chamber (195) is located at the top of the heat exchanger (175) as shown in FIGS. 1 and 4. Optionally, a vacuum pump (196) may be used to pump out the non-condensable gas chamber (195). Such vacuum pump (196) is operably connected to the non-condensable gas chamber (195) for removing the collected non-condensable gases and also for holding the system at less than atmospheric pressure.

Figure 5:
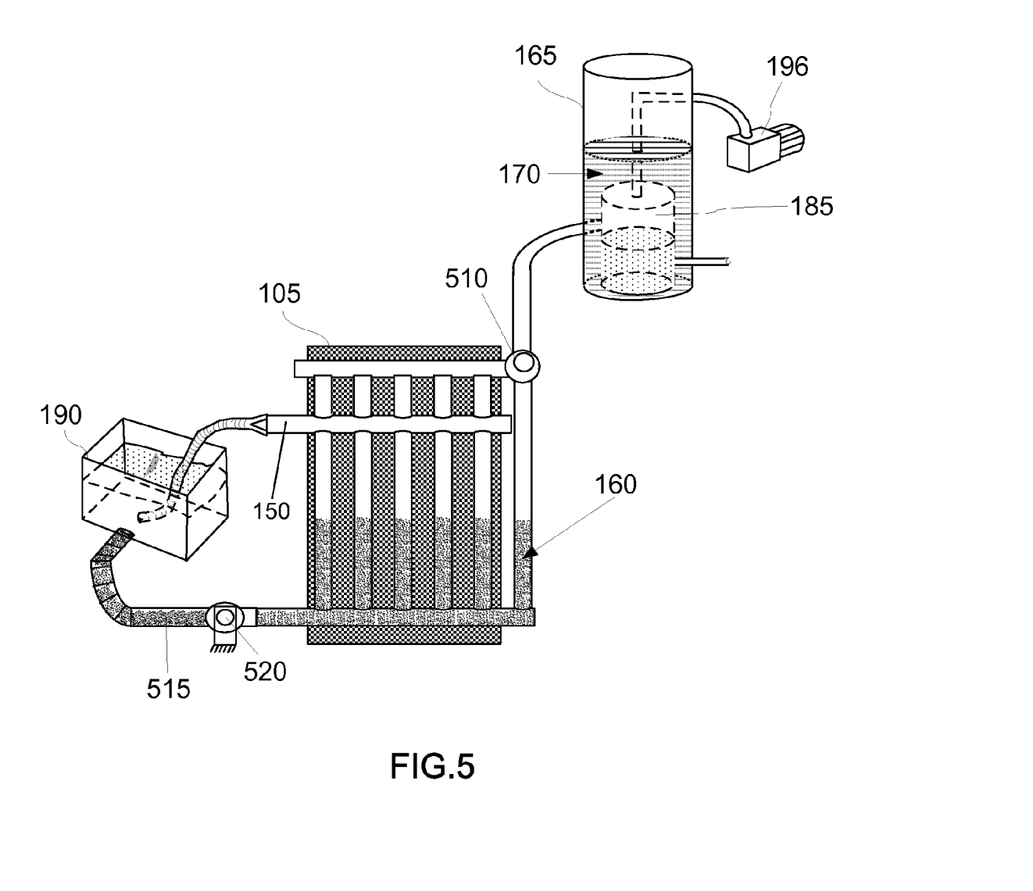
FIG. 5 is an alternative embodiment of the solar energy system that has a distilled water tank within the thermal storage tank.

An alternative embodiment of the solar energy system (100) includes a bypass pipe (180) interconnecting the top-horizontal pipe (145) to the bottom-horizontal pipe (140), preferably so that the bypass pipe (180) does not flowably interconnect with the working-fluid-supply pipe (150). From this connection, a pipe connects upward into the heat exchanger (175). The junction of these pipes is preferably a T-connection pipe joint (146), which is well known. This permits entrained liquid in the gaseous working fluid to drain back into the plurality of vertically-tilted pipes (115) before the gaseous working fluid enters the heat exchanger (175). Thus, in one exemplary embodiment, the heat exchanger (175) is in fluid communication with the top-horizontal pipe (145) and the bottom-horizontal pipe (140), where the top-horizontal pipe (145) is for gaseous working fluid. A liquid-vapor separator (510), which is well known in the field, may be used instead of a T-connection pipe joint (146) to improve liquid-vapor separation. Thus, in an alternative embodiment, a liquid-vapor separator (510) is installed at the junction of the top-horizontal pipe and the bypass pipe (180), as shown in FIG. 5.

An alternative embodiment of the solar energy system (100) includes a distilled water storage tank (185) connected to the heat exchanger (175) such that the liquid (160) state of the working fluid in the heat exchanger (175) flows into the distilled water storage tank (185). The distilled water storage tank (185) may be separated from the thermal storage tank (165), as shown in FIG. 1. Alternatively, the distilled water storage tank (185) may be located inside the thermal storage tank (165), as shown in FIG. 5. For these alternatives, the distilled water storage tank (185) is in fluid communication with at least one of the required three horizontal pipes so as to receive the working fluid in gaseous state and condense it to a liquid (160) state by transferring heat to the heat storage medium (170) through the walls of the distilled water storage tank (185). A water pump may be used to draw distilled water out of the distilled water container, or it may be valved to flow out of the distilled water storage tank (185) via gravity when desired.

An alternative embodiment of the solar energy system (100) includes a working-fluid-supply tank (190), which when water is the working fluid is also referred to as a raw water tank. The working-fluid-supply tank (190) is in fluid communication with the working-fluid-supply pipe (150). This serves as a make-up supply or when the working fluid is removed in distilled or purified form, it serves as a continuous supply of working fluid. Raw water in the raw water tank may be supplied from any source, such as for example, tap water, water from river, well water, rain water, or sea water. A flush-water pipe (515) may be added to connect the bottom-horizontal pipe to the raw water tank to prevent a higher contaminant concentration level in the working-fluid from forming due to water evaporation inside of the solar collector. A water pump (520) may be connected to the flush-water pipe (515) to aid in power flushing all of the pipes in the solar energy system (100). Thus, for this and other embodiments, the working-fluid-supply tank (190) is in fluid communication with the bottom horizontal pipe (140) via the working-fluid-supply tank (190).

Figure 7:
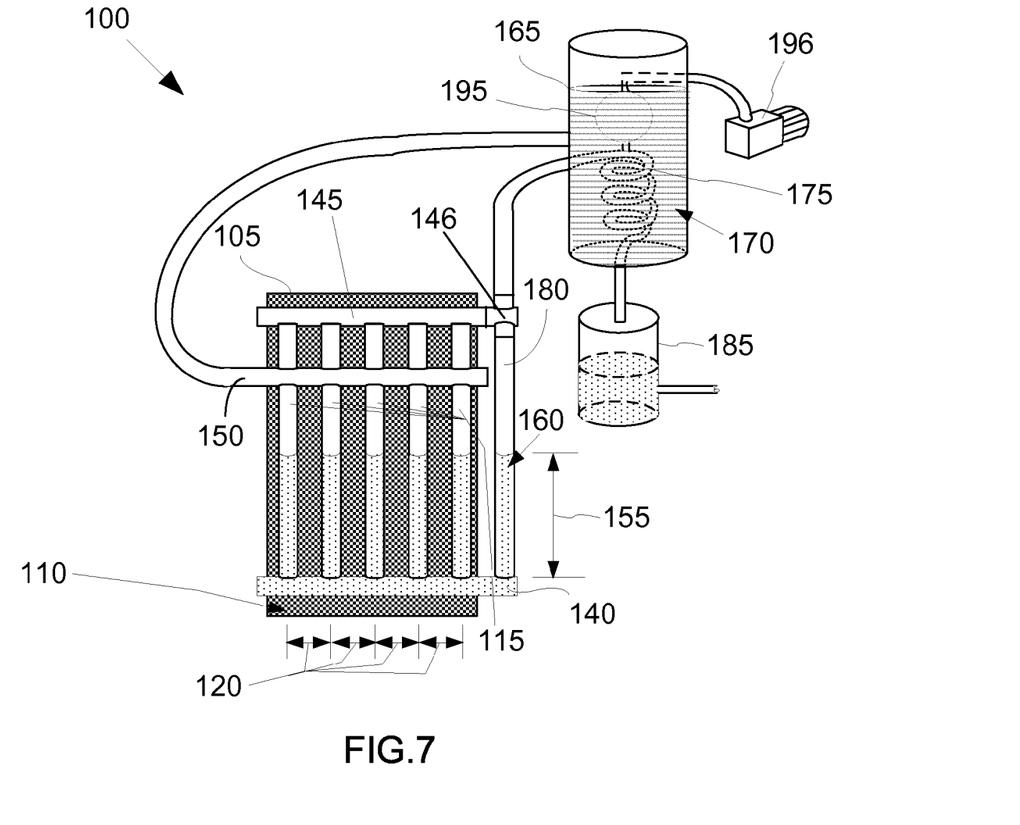
FIG. 7 is an alternative embodiment of the solar energy system where the thermal storage tank is also a raw water tank.

If the heat storage medium (170) is also water, then the thermal storage tank (165) may also be used as raw water tank, which would effectively make this tank a raw water and thermal tank, as shown in FIG. 7. In this case, tap water may be supplied to the thermal tank (165), and part of it is turned into distilled water, and other is turned into hot water for domestic use.

Example of Distilled Water Operation

In operation, the solar energy system (100) is maintained at less than atmospheric pressure initially set by operation of the vacuum pump (196). A liquid (160) working fluid is raw water that is drawn into the plurality of vertically-tilted pipes (115) through working-fluid-supply pipe (150) by the vacuum (or partial vacuum) inside. The amount or the speed is controlled by a valve or throttle. The raw water is vaporized in the plurality of vertically-tilted pipes (115) by the thermal power of the sun while the sun-facing side (210) of the solar energy receiver (105) absorbs heat from solar radiation. Vaporized water goes up, moves through the top-horizontal pipe (145), which is designated in this example as the vapor pipe. The vaporized water flows into the heat exchanger (175), which is a coiled copper tube immersed within the heat storage medium (170) of the thermal storage tank. The connection at the junction of the top-horizontal pipe (145) and the bypass pipe (180) is preferably a T-connection pipe joint (146). The heat storage medium (170) is liquid water that is heated as the vaporized water condenses in the coiled copper tube. Prior to entering the thermal storage tank (165), any liquid entrained in the vapor stream is carried back into the plurality of vertically-tilted pipes (115) through the bypass pipe (180). A liquid-vapor separator (510), which is well known in the field, may be used instead of a T-connection pipe joint (146) for better water-vapor separation. After entering the thermal storage tank (165), condensed water flows into the distilled water storage tank (185) as shown in FIG. 1. Thus, water vapor is condensed into liquid, or in this case distilled water, as it goes down the winding pipe, releasing the heat to the surrounding heat storage medium (170), which in this case is also water. Any non-condensable gas, e.g., oxygen, nitrogen, carbon dioxide, etc., is collected in the non-condensable gas chamber (195) to be periodically evacuated using the vacuum pump (196).

The above-described embodiments including the drawings are examples of the invention and merely provide illustrations of the invention. Other embodiments will be obvious to those skilled in the art. Thus, the scope of the invention is determined by the appended claims and their legal equivalents rather than by the examples given.

INDUSTRIAL APPLICABILITY

The invention has application to the solar energy industry.

What is claimed is:

1. A solar energy system comprising:
   a solar energy receiver selected from the group consisting of a flat plate collector, and a panel of photovoltaic cells; the solar energy receiver comprising a bottom side opposite a sun-facing side, the sun-facing side receiving incident solar energy radiation;
   a plurality of vertically-tilted pipes, wherein each vertically-tilted pipe in the plurality of vertically-tilted pipes comprises a top section, a middle section and a bottom section;
   the plurality of vertically-tilted pipes being in thermal communication with the bottom side of the solar energy receiver;
   at least three horizontal pipes flowably interconnect each of the plurality of vertically-tilted pipes, the three horizontal pipes comprise the required three horizontal pipes; the required three horizontal pipes consisting of: a bottom-horizontal pipe located in the bottom section; a top-horizontal pipe located in the top section; and a working-fluid-supply pipe located in the top section, wherein, the top-horizontal pipe is located above the working-fluid-supply pipe;
   a working fluid filling the bottom-horizontal pipe and a portion of each vertically-tilted pipe in the plurality of vertically-tilted pipes, the working fluid consisting of a liquid at atmospheric temperature and pressure;
   a thermal storage tank comprising a heat storage medium; and
   a heat exchanger within the thermal storage tank, the heat exchanger in fluid communication with at least one of the required three horizontal pipes.

2. The system of claim 1, further comprising a piped connection between the heat exchanger and the working-fluid-supply pipe such that the liquid state of the working fluid in the heat exchanger is at a higher elevation than, and thus returned by gravity to, the plurality of vertically-tilted pipes.

3. The system of claim 1, further comprising a bypass pipe interconnecting the top-horizontal pipe to the bottom-horizontal pipe.

4. The system of claim 3, further comprising a liquid vapor separator at the junction of the top-horizontal pipe and the bypass pipe.

5. The system of claim 1, further comprising a distilled water storage tank connected to the heat exchanger such that the liquid state of the working fluid in the heat exchanger flows into the distilled water storage tank.

6. The system of claim 1, further comprising a working-fluid-supply tank in fluid communication with the working-fluid-supply pipe.

7. The system of claim 6, wherein the working-fluid-supply tank is in fluid communication with the bottom horizontal pipe.

8. The system of claim 6, further comprising a vacuum pump connected to a non-condensable gas chamber and operable to remove non-condensable gases in the non-condensable gas chamber and to hold the system at less than atmospheric pressure.

9. The system of claim 1, further comprising a non-condensable gas chamber connected to the heat exchanger and operable to permit non-condensable gases in the working fluid in gaseous state to flow into the non-condensable gas chamber.

10. The system of claim 1, wherein the heat storage medium in the thermal storage tank comprises water.

11. The system of claim 10 wherein the thermal storage tank is in fluid communication with the working-fluid-supply pipe, such fluid communication enabling flow of heat storage medium from the thermal storage tank into the working-fluid-supply pipe.

12. A solar energy system comprising:
   a solar energy receiver selected from the group consisting of a flat plate collector, and a panel of photovoltaic cells; the solar energy receiver comprising a bottom side opposite a sun-facing side, the sun-facing side receiving incident solar energy radiation;
   a plurality of vertically-tilted pipes wherein each vertically-tilted pipe in the plurality of vertically-tilted pipes comprises a top section, a middle section and a bottom section;
   the plurality of vertically-tilted pipes being in thermal communication with the bottom side of the solar energy receiver so as to function as a heat sink for the solar energy receiver;
   at least three horizontal pipes flowably interconnect each of the plurality of vertically-tilted pipes, the three horizontal pipes comprise the required three horizontal pipes;

the required three horizontal pipes consisting of: a bottom-horizontal pipe located in the bottom section; a top-horizontal pipe located in the top section; and a working-fluid-supply pipe located in the top section, the top-horizontal pipe located above the working-fluid-supply pipe;

a working fluid filling the bottom-horizontal pipe and a portion of each vertically-tilted pipe in the plurality of vertically-tilted pipes, the working fluid comprising liquid water;

a thermal storage tank comprising a heat storage medium; and a distilled water storage tank located inside the thermal storage tank, the distilled water storage tank in fluid communication with at least one of the required three horizontal pipes so as to receive the working fluid in gaseous state and condense it to a liquid state by transferring heat to the heat storage medium.

13. A solar energy system comprising:

a plurality of solar energy receivers;

each solar energy receiver in the plurality of solar energy receivers selected from the group consisting of a flat plate collector, and a panel of photovoltaic cells;

each solar energy receiver in the plurality of solar energy receivers comprising a bottom side opposite a sun-facing side, the sun-facing side receiving incident solar energy radiation;

a plurality of vertically-tilted pipes spaced apart wherein each vertically-tilted pipe in the plurality of vertically-tilted pipes comprises a top section, a middle section and a bottom section;

the plurality of vertically-tilted pipes being in thermal communication with the bottom side of each solar energy receiver in the plurality of solar energy receivers so as to function as a heat sink for each such solar energy receiver;

at least three horizontal pipes flowably interconnect each of the plurality of vertically-tilted pipes, the three horizontal pipes comprise the required three horizontal pipes; the required three horizontal pipes consisting of: a bottom-horizontal pipe located in the bottom section; a top-horizontal pipe located in the top section; and a working-fluid-supply pipe located in the top section, the top-horizontal pipe located above the working-fluid-supply pipe;

the top-horizontal pipe in each solar energy receiver in the plurality of solar energy receivers being interconnected;

the bottom-horizontal pipe in each solar energy receiver in the plurality of solar energy receivers being interconnected;

the working-fluid-supply pipe in each solar energy receiver in the plurality of solar energy receivers being interconnected;

a working fluid filling the bottom-horizontal pipe and a portion of each vertically-tilted pipe in the plurality of vertically-tilted pipes, the working fluid consisting of a liquid at atmospheric temperature and pressure;

a thermal storage tank comprising a heat storage medium; and a heat exchanger within the thermal storage tank, the heat exchanger in fluid communication with at least one of the required three horizontal pipes so as to receive the working fluid in gaseous state and condense it to a liquid state by transferring heat to the heat storage medium.

14. The system of claim 13, further comprising a bypass pipe interconnecting the top-horizontal pipe to the bottom-horizontal pipe.

* * * * *